United States Patent [19]
Huang

[11] Patent Number: 6,010,822
[45] Date of Patent: Jan. 4, 2000

[54] PROCESS FOR PREPARING A NITROCELLULOSE COATED POLYPROPYLENE FILM

[75] Inventor: Misty Huang, Suffern, N.Y.

[73] Assignee: MacDermid, Incorporated, Waterbury, Conn.

[21] Appl. No.: 08/982,713

[22] Filed: Dec. 2, 1997

[51] Int. Cl.$^7$ .................. G03F 7/11; B05D 1/00
[52] U.S. Cl. .............. 430/273.1; 427/223; 427/322; 427/536; 428/509
[58] Field of Search ............. 428/509; 427/225, 427/322, 536; 430/273.1

[56] References Cited

U.S. PATENT DOCUMENTS

| | | | |
|---|---|---|---|
| 2,888,368 | 5/1959 | Grantham | 117/145 |
| 3,323,937 | 6/1967 | Garden et al. | 117/47 |
| 3,755,260 | 8/1973 | Spurlin | 260/75 TN |
| 3,892,900 | 7/1975 | Shima et al. | 428/40 |
| 4,247,576 | 1/1981 | Kutner | 427/40 |
| 4,725,454 | 2/1988 | Galli et al. | 427/208 |
| 4,917,260 | 4/1990 | Heyes et al. | 220/270 |
| 5,039,592 | 8/1991 | Umeda | 430/273.1 X |
| 5,464,690 | 11/1995 | Boswell | 428/334 |
| 5,697,715 | 12/1997 | Kuroda | 400/237 |

FOREIGN PATENT DOCUMENTS

| | | |
|---|---|---|
| 54-74873 | 6/1979 | Japan . |
| 1050253 | 12/1966 | United Kingdom . |
| 1061876 | 3/1967 | United Kingdom . |

*Primary Examiner*—Cynthia Hamilton
*Attorney, Agent, or Firm*—John L. Cordani

[57] ABSTRACT

Polypropylene film coated with a submicron thickness of a composition comprising mitrocellulose is proposed as useful in the production of photopolymer printing plates. In addition to nitrocellulose, the coating composition also preferably comprises a solvent, lecithin and a wax.

12 Claims, 1 Drawing Sheet

PROCESS FOR PREPARING A NITROCELLULOSE COATED POLYPROPYLENE FILM

BACKGROUND OF THE INVENTION

This invention relates to coated polypropylene film. More particularly, this invention relates to oriented polypropylene film coated with a submicron thickness of a composition comprising nitrocellulose, to its process of preparation and its use in the preparation of printing plates.

In the past, polymer film, particularly uncoated polypropylene film, has been used to separate the negative from the liquid photopolymer when preparing plastic printing plates. In such use, a negative, usually consisting of halftones and line copy, is covered with a thin transparent polymer film (sometimes called a cover film). Over the film is spread a liquid photopolymer and then a backing sheet or substrate is usually added. The cover film serves to protect the negative from the liquid photopolymer. This assembly is exposed through the negative to some form of radiation, e.g., actinic light, for a period of time sufficient to harden the liquid photopolymer in those areas where it is not shielded by the negative. The resulting exposed plate is then separated from the negative and the thin polymer film used to separate the negative from the photopolymer is peeled off the face of the resulting plate. Finally, the unhardened photopolymer is removed, usually by washing, from the unexposed areas and, if desired, the plate is hardened by post-exposure. While uncoated polymer films have been used as separators or cover films in processes as described above, they have caused certain difficulties. For example, the uncoated polypropylene film sometimes sticks to the plate and slivers or tears as it is peeled from it. Also, distortions in the image may occur which take the form of elongated highlight dots and broadened or split rules, which is attributed to photopolymer flow at the interface between the plate relief surface and the uncoated polypropylene film during the imaging (i.e. exposing) step.

U.S. Pat. No. 4,247,576 (Kunter) the disclosures of which are incorporated herein by reference in their entirety, discloses a silicate coated polypropylene film which was used for purposes similar to the purposes of this invention. However, when using waterborne coatings the silicate based materials of Kunter frequently cause streaking problems on the polypropylene film. When a streaky polypropylene film is used in an imaging process, such as a substrate or cover for imaging printing plates, the streaks cause imperfections in the imaging process.

This invention addresses the streaking problems associated with the compositions of Kunter and proposes a composition comprising nitrocellulose for coating the polypropylene film. These nitrocellulose coatings solve the streaking problem of Kunter, yet maintain the desirable release and other properties achieved by the Kunter silicate compositions.

SUMMARY OF THE INVENTION

This invention proposes an oriented polypropylene film coated with a composition comprising nitrocellulose and the coated film's use in the preparation of printing plates. Thus, this invention proposes coating an oriented polypropylene film with a submicron thickness of a composition comprising nitrocellulose. The nitrocellulose in the composition is preferably dissolved in a solvent such as a mixture of isopropanol and n-propanol acetate. The composition may also preferably comprise a release agent, a surfactant and/or a dye.

BRIEF DESCRIPTION OF THE DRAWINGS

The above and other objects, features and advantages of the present invention will become more readily apparent from the following description, reference being made to the accompanying drawing in which.

Figure 1:
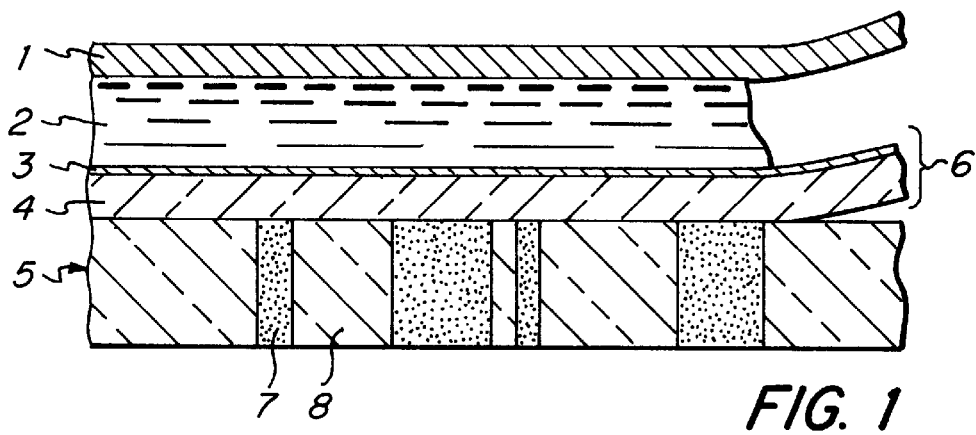
FIG. 1 is a cross-sectional illustration of a typical assembly being laid down for the preparation of a plastic printing plate.

The layers of the assembly in each FIG. not being drawn to scale.

DETAILED DESCRIPTION OF THE INVENTION

An oriented polypropylene film, coated with a composition comprising nitrocellulose, useful in the preparation of printing plates, is disclosed. The nitrocellulose is preferably dissolved in a solvent in the coating composition and the coating composition preferably also comprises a silicon release agent, a surfactant, lecithin and a wax.

The most preferred coating composition comprises:
 a). nitrocellulose;
 b). solvent;
 c). a silicon release agent;
 d). optionally, a surfactant; and
 e). optionally lecithin and/or a wax.

The concentration of nitrocellulose in the coating composition may range from 0.5 to 10 percent by weight but is preferably from 2 to 5 percent by weight. The inventor has found that nitrocellulose RS, 1/2 sec available from Hercules Incorporated, Wilmington, Del. is particularly suitable for this purpose.

The solvent is preferably organic and should be compatible with the other components of the coating composition. The concentration of the solvent in the coating composition should be such that it makes up the balance of the composition after taking the other ingredients into account. Generally, the concentration of the solvent in the coating composition will range from 80 to 98 weight percent.

The silicon based released agent can be the silicate based materials of Kunter such as lithium silicate, sodium silicate and potassium silicate. Other examples of silicon based release agents which will work with this invention are ethylmethyl, methyl 2-phenylpropyl siloxane. The concentration of the silicon release agent may range from 0.25 to 2.0 percent by weight but is preferably from 0.5 to 1.0 percent by weight.

Various surfactants may be used to ensure wetting of the film, by the composition of the invention. Anionic or nonionic surfactants are preferred. Typical surfactants include sodium dioctyl sulfosuccinate, sodium lauryl sulfate, sodium benzenesulfonate, potassium laurate, sodium stearate and the like. The concentration of the surfactant may range from 0.05 to 1.0 percent by weight but is preferably from 0.1 to 0.3 percent be weight.

Lecithin, also known as phosphatidylcholine, is a well known material available from a variety of chemical suppliers such as Sigma Chemical Company of St. Louis, Mo., and W. A. Cleary Co. of Somerset, N.J. The concentration of lecithin in the coating composition may range from 0.1 to 1.0 percent by weight, but is preferably from 0.2 to 0.5 percent be weight.

The wax in the preferred coating composition provides lubrication properties, and preferably has a melting point above room temperature, but less than about 60° C. Synthetic spermaceti or waxes based upon fatty acids are preferred waxes. Synthetic spermaceti is available from a variety of suppliers including Koster Keunen, Inc. of Watertown, Conn. Fatty acid based waxes are also available from a variety of suppliers, including Mona Industrials, Inc. of Patterson, N.J. who sell Mona-wet MO-70 which is a fatty acid based wax which works well in the composition of this invention. The concentration of wax in the coating composition may range from 0.01 to 0.1 percent by weight but is preferably from 0.05 to 0.08 percent by weight.

Figure 2:
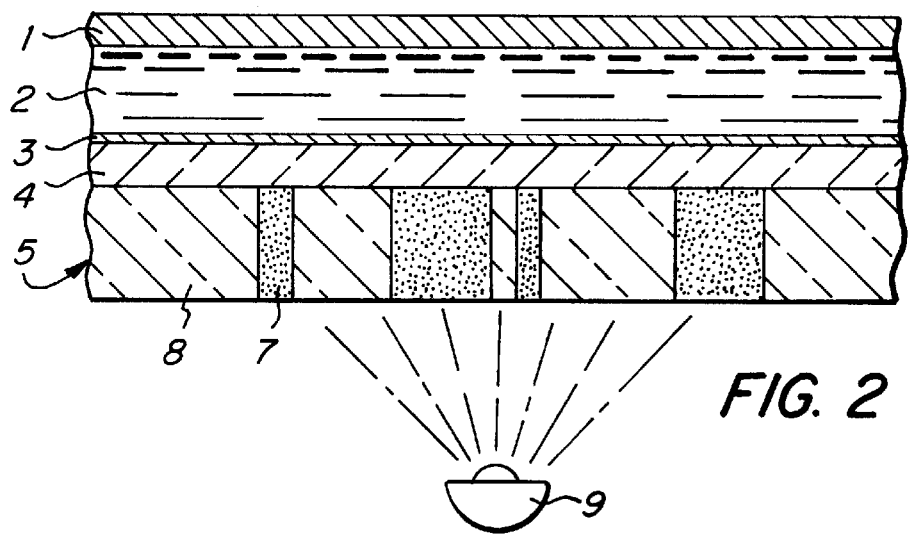
FIG. 2 is a cross-sectional illustration of the assembly being exposed to a light source.
Figure 3:
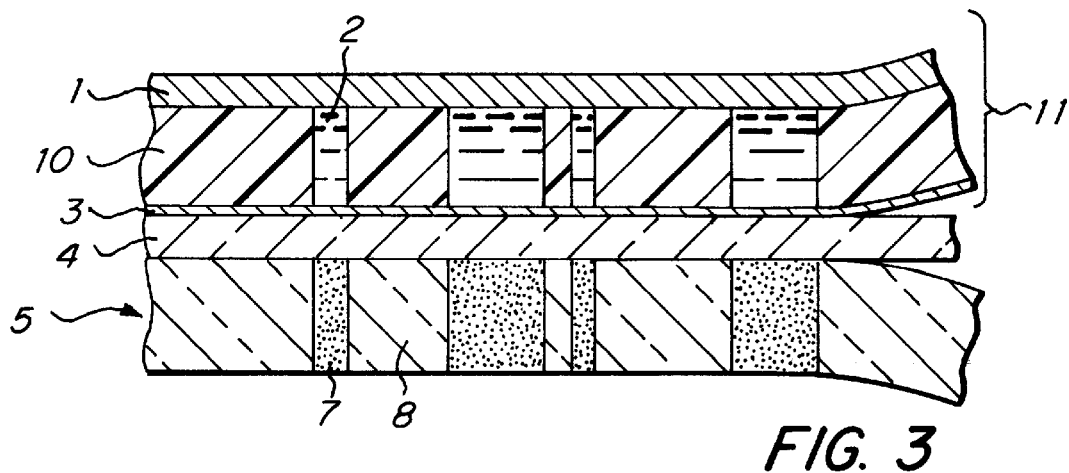
FIG. 3 is a cross-sectional illustration of the assembly being separated after exposure to the light source.

Referring to FIGS. 1–3, from which the principles of the present invention may become more readily understandable, it will be observed that in laying down a typical assembly for the preparation of a plastic printing plate using a liquid photopolymer the negative 5 forms the bottom layer. Over the negative 5 and separating it from the liquid photopolymer 2 is laid a cover or separating film 6. The cover film 6 of this invention is an oriented polypropylene film 4 coated on its upper side with a submicron thickness of the coating composition 3. The liquid photopolymer 2 is spread evenly over the cover film 6 and finally a backing sheet 1 may be placed on top. After the assembly is completed, it is exposed through the negative 5 to a light source 9 for a period of time sufficient to form hardened photopolymer 10 behind those areas where the negative 5 is transparent 8. Behind those areas where the negative 5 is opaque 7, the photopolymer will remain liquid 2. After exposure, the resulting partially hardened photopolymer sheet 11 will be separated from the polypropylene film 4 and negative 5. It will be noted that the submicron thickness of the coating composition 3 preferentially adheres to the solidified areas on the face of the sheet 11. To convert the sheet 11 to a relief printing plate, the liquid photopolymer 2 will be removed (usually by washing) from the unexposed areas.

The oriented polypropylene film used to prepare the coated films of this invention is well known in the art and provides a combination of good clarity, UV transparency, and desirable refractive index, which properties provide good fidelity and etch depth in the reverses of photopolymer relief plates prepared using them in general, the thickness of the film will be from about 0.25 to about 2.0 mils, most preferably from about 0.5 to about 1.0 mil. So as to provide good coverage of the film surface by the coating solution, the film will preferably be treated to improve its wettability before it is coated. Various methods of improving the wettability of polypropylene, such as flame treatment, corona discharge and glow discharge, are well known in the art.

The following examples will illustrate the process of preparing the coated polypropylene films and their use as cover or separating films in preparing printing plates.

EXAMPLE I

The following coating composition was prepared:

| | |
|---|---|
| Nitrocellulose RS, ½ sec | 4% by weight |
| Methyl ethyl ketone/isobutyl acetate (12/1) solvent | 95.75% by weight |
| Lecithin | 0.02% by weight |
| Synthetic Spermaceti | 0.05% by weight |
| Aerosol OT-75% | 0.15% by weight |
| Methylene Violet | 0.0002% by weight |

The coating composition was wiped onto the surface of a 75 gauge (0.75 mil), corona treated, oriented polypropylene film, with the aid of a soft felt cloth. On drying the film, a good, adherent coating about 0.2 microns thick (approximately 0.10 mg ($m^2$) is formed.

The coated film is used as a cover film over a negative, consisting of halftones and line copy (with the coated side toward the photopolymer) to prepare a photopolymer printing plate. On completion of the irradiation, the coated film is peeled from the plate surface, and the liquid photopolymer remaining in the non-exposed (ie. non-image) areas was washed away with a mild, aqueous anionic detergent solution. A replica of the image from the negative is left in relief. The plate is post-cured to remove background tack by irradiating it in front of a mercury arc lamp for one minute.

A proof copy of this plate shows a faithful reproduction of the round highlight dots as well as the rules and other image elements present in the negative.

Another plate is prepared using the same negative and photopolymer as above, but with a polypropylene cover film which has not been coated. The proof copy of this plate shows the presence of elongated highlight dots. In addition some of the rules are broadened, and in some cases a secondary, irregular line not present in the negative is produced.

EXAMPLE II

Example I was repeated except that the composition used was the following:

| | |
|---|---|
| Nitrocellulose RS, ½ sec | 4.8% by weight |
| Isobutyl Acetate | 10% by weight |
| Methyl Ethyl Ketone | 85% by weight |
| Aerosol OT-75% | 0.2% by weight |

Similarly good results were obtained.

EXAMPLE III

Example I was repeated except that the composition used was the following:

| | |
|---|---|
| Nitrocellulose RS 18–25 cps | 4% by weight |
| Isobutyl acetate | 7.98% by weight |
| Methyl Ethyl Ketone | 80.8% by weight |
| Spermatici (1% in MEK) | 5% by weight |
| Aerosol OT-75% | 0.2% by weight |
| Lecithin (10% in MEK) | 2% by weight |
| Methylene Violet (1% in ethanol) | 0.02% by weight. |

Similarily good results were obtained.

EXAMPLE IV

Example I was repeated except that the composition used was the following:

| | |
|---|---|
| Nitrocellulose RS ½ sec | 4% by weight |
| Aerosol OT-75% | 0.2% by weight |
| Ethylmethyl, methyl 2-phenylpropyl siloxane | 0.5% by weight |
| Ethylene violet (1% solution) | 0.02% by weight |
| Methyl ethyl ketone | 95.28% by weight |

Similarily good results were obtained.

What is claimed is:

1. A process for preparing cover film used to separate a negative from photopolymer when manufacturing printing plates, said process comprising coating oriented polypropylene film with a submicron thick coating of a composition, which composition comprises nitrocellulose and a release agent wherein said release agent comprises a silicon release agent.

2. A process according to claim 1 wherein the composition also comprises a wax.

3. A process according to claim 2 wherein the composition also comprises lecithin.

4. A process according to claim 1 wherein the composition also comprises lecithin.

5. A process for preparing cover film used to separate a negative from a photopolymer when manufacturing printing plates, said process comprising coating oriented polypropylene film with a submicron thick coating of a composition, which composition comprises nitrocellulose and lecithin.

6. A process according to claim 5 wherein the composition also comprises a silicon release agent.

7. A process according to claim 6 wherein the composition also comprises a wax.

8. A process according to claim 5 wherein the composition also comprises a wax.

9. A process for preparing cover film to separate a negative from a photopolymer when manufacturing printing plates, said process comprising coating oriented polypropylene film with a submicron thick coating of a composition, which composition comprises nitrocellulose and a wax.

10. A process according to claim 9 wherein the composition also comprises a silicon release agent.

11. A process according to claim 10 wherein the composition also comprises lecithin.

12. A process according to claim 9 wherein the composition also comprises lecithin.

* * * * *